(12) United States Patent
Hobbs et al.

(10) Patent No.: US 11,275,414 B2
(45) Date of Patent: Mar. 15, 2022

(54) HEAT DISSIPATION WALL SYSTEM

(71) Applicant: Dell Products L.P., Round Rock, TX (US)

(72) Inventors: Derric Christopher Hobbs, Round Rock, TX (US); Christopher Michael Helberg, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/946,643

(22) Filed: Jun. 30, 2020

(65) Prior Publication Data
US 2021/0405717 A1    Dec. 30, 2021

(51) Int. Cl.
*G06F 1/20* (2006.01)
*G06F 1/18* (2006.01)
*H05K 7/20* (2006.01)

(52) U.S. Cl.
CPC .................. *G06F 1/20* (2013.01); *G06F 1/18* (2013.01); *H05K 7/20145* (2013.01); *G06F 2200/201* (2013.01)

(58) Field of Classification Search
CPC ........ G06F 1/20; G06F 1/18; G06F 2200/201; G06F 1/203; H05K 7/20145
See application file for complete search history.

(56) References Cited

U.S. PATENT DOCUMENTS

| | | | | |
|---|---|---|---|---|
| 6,453,378 B1 * | 9/2002 | Olson | .................. | G06F 1/1632 361/679.41 |
| 8,248,780 B2 * | 8/2012 | Zheng | ...................... | G06F 1/16 361/679.47 |
| 8,289,715 B2 * | 10/2012 | Takahara | ........... | H05K 7/20972 361/721 |
| 9,607,182 B1 * | 3/2017 | McIntosh | .................. | G06F 1/26 |
| 10,582,644 B1 * | 3/2020 | Hur | .................... | H05K 7/20409 |
| 2012/0314366 A1 * | 12/2012 | Noborio | ................ | G06F 1/1658 361/692 |
| 2013/0135814 A1 * | 5/2013 | Lee | ......................... | G06F 1/184 361/679.33 |

(Continued)

OTHER PUBLICATIONS

Zhang, Yafan; "Experimental and CFD Evaluation of Humidity Management Methods of Ruggedizing a COTS Electronics System for a Severe Climatic Environment", Jbnkbping Institute of Technology, Electrical Engineering; May 28, 2008; 74pp.

*Primary Examiner* — Stephen S Sul
(74) *Attorney, Agent, or Firm* — Joseph Mencher

(57) ABSTRACT

A heat dissipation wall system includes a base wall having an outer surface, a plurality of side walls extending approximately perpendicularly from the base wall to define a component housing between the base wall and the side walls, and a plurality of heat dissipation channels defined by the base wall and extending into the base wall from the outer surface. Each of the heat dissipation channels includes a respective first airflow aperture that extends through the base wall from the outer surface to the component housing and that is configured to allow an airflow adjacent the outer surface to enter the component housing, and a respective second airflow aperture that is spaced apart from the first airflow aperture, that extends through the base wall from the outer surface to the component housing, and that is configured to allow an airflow adjacent the outer surface to enter the component housing.

20 Claims, 18 Drawing Sheets

(56) References Cited

U.S. PATENT DOCUMENTS

| | | | |
|---|---|---|---|
| 2016/0291650 A1* | 10/2016 | Lee | G06F 1/1613 |
| 2017/0060199 A1* | 3/2017 | Kim | G06F 1/20 |
| 2019/0215972 A1* | 7/2019 | Jang | G06F 1/181 |
| 2020/0260602 A1* | 8/2020 | Gao | G06F 1/20 |

* cited by examiner

HEAT DISSIPATION WALL SYSTEM

BACKGROUND

The present disclosure relates generally to information handling systems, and more particularly to dissipating heat in an information handling system via an information handling system wall.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server computing devices, desktop computing devices, laptop/notebook computing devices, tablet computing devices, mobile phones, and/or other computing devices known in the art, continue to be designed and manufactured in smaller and smaller sizes, thus requiring smaller thermal solutions that are more efficient. For example, desktop computing devices such as those included in the OPTIPLEX® family of desktop computing devices available from DELL® Inc. of Round Rock, Tex., United States, provide a compute module that may be housed in a display stand that defines a relatively small volume in which the computing module may be located (while also capable of being attached to a mounting bracket on a display, attached to a wall mount, or simply placed on a desktop surface). Furthermore, such "desktop computing devices may be configurable to provide with different capabilities. For example, some of the desktop computing devices included in the OPTIPLEX® family of desktop computing devices available from DELL® Inc. of Round Rock, Tex., United States, provide an option bay on the computing module that allows a storage device (e.g., a Solid State Drive (SSD) such as an M.2 SSD) to be connected to the computing module. However, given the limited volume available in the display stand, it can be difficult to provide adequate cooling for the storage device when it is connected to the computing module and both are housed in the display stand, as that limited volume prevents the use of conventional heat sinks and fan systems.

Accordingly, it would be desirable to provide a heat dissipation system that addresses the issues discussed above.

SUMMARY

According to one embodiment, an Information Handling System (IHS) includes a chassis; a heat producing component that is coupled to the chassis; and a heat dissipation cover that is coupled to the chassis adjacent the heat producing component, wherein the heat dissipation cover includes: a base wall that includes an outer surface and that is spaced apart from the chassis; a plurality of side walls extending between the base wall and the chassis in order to define a component housing that is located between the base wall, the plurality of side walls, and the chassis, and that houses the heat producing component; and a plurality of heat dissipation channels that are defined by the base wall and that extend into the base wall from the outer surface, wherein each of the plurality of heat dissipation channels includes: a respective first airflow aperture that extends through the base wall from the outer surface to the component housing and that is configured to allow an airflow adjacent the outer surface to enter the component housing; and a respective second airflow aperture that is spaced apart from the first airflow aperture, that extends through the base wall from the outer surface to the component housing, and that is configured to allow an airflow adjacent the outer surface to enter the component housing.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
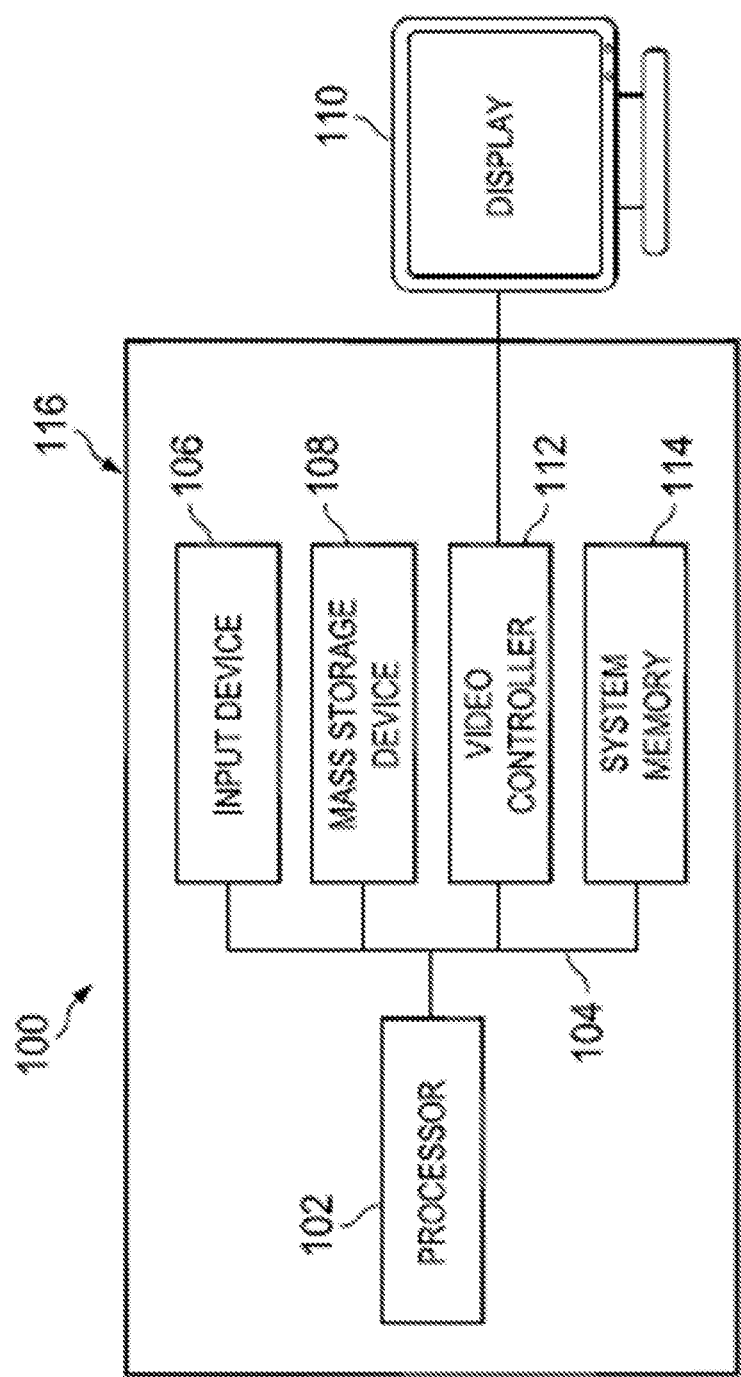
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
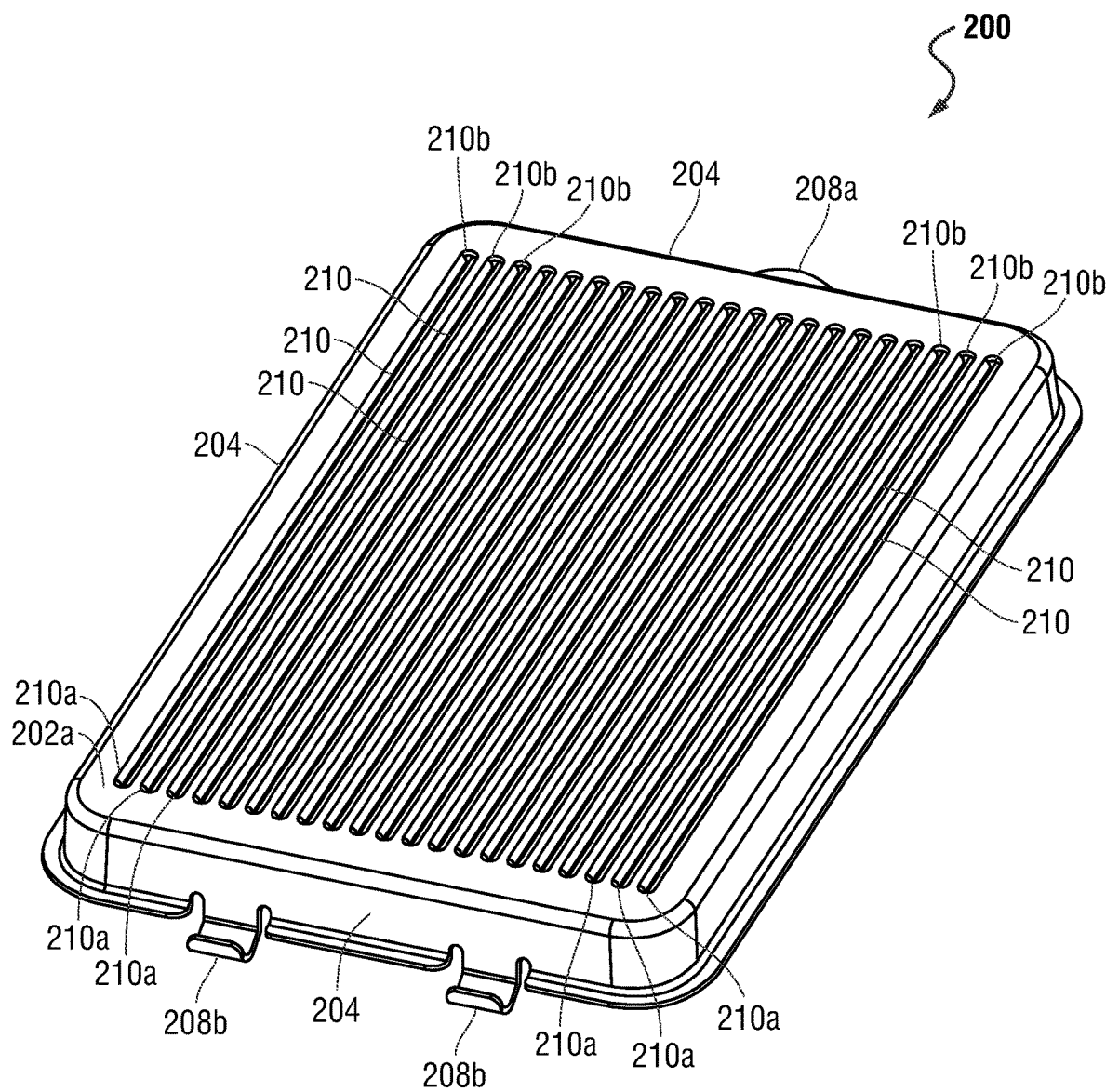
FIG. 2A is a top perspective view illustrating an embodiment of a heat dissipation cover that may provide the heat dissipation wall system of the present disclosure.
Figure 2B:
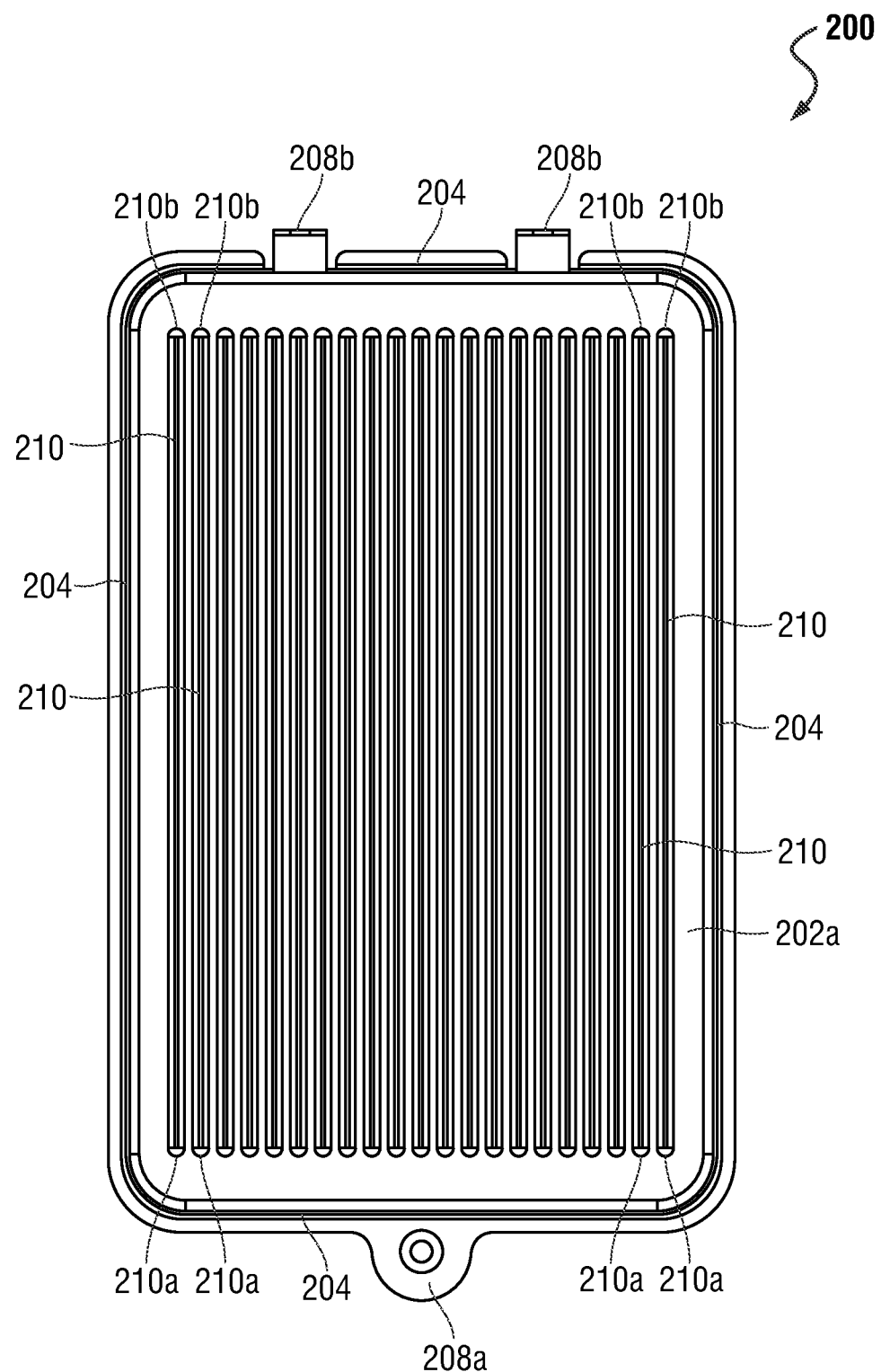
FIG. 2B is a top view illustrating an embodiment of the heat dissipation cover FIG. 2A.
Figure 2C:
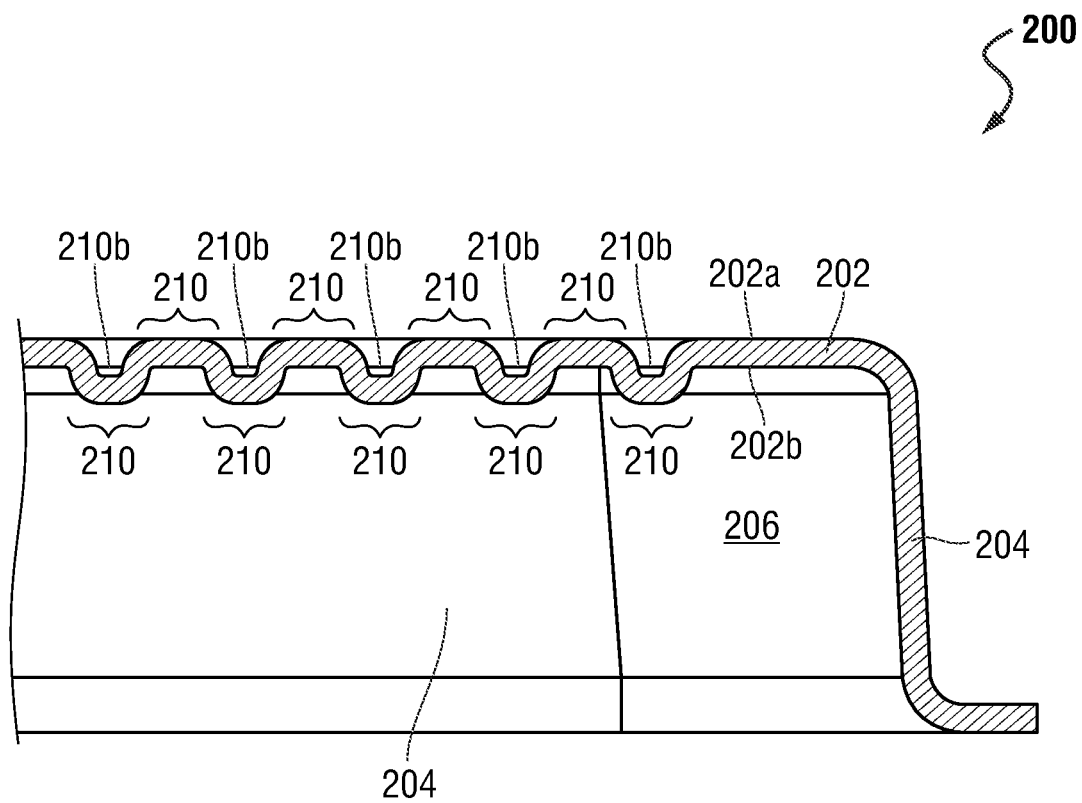
FIG. 2C is a cross-sectional view illustrating an embodiment of the heat dissipation cover of FIGS. 2A and 2B.

Referring now to FIGS. 2A, 2B, and 2C, an embodiment of a heat dissipation cover 200 is illustrated that may provide the heat dissipation wall system of the present disclosure. However, while the heat dissipation wall system of the present disclosure is illustrated and described herein as being implemented on a heat dissipation cover, one of skill in the art in possession of the present disclosure will appreciate that the heat dissipation wall system may be provided as part of a computing device chassis (e.g., a chassis wall located adjacent a heat producing component) while remaining within the scope of the present disclosure as well. In some embodiments, the heat dissipation cover 200 may be fabricated using conductive metal materials (e.g., a sheet-metal material) such as, for example, steel, aluminum, and/or any of a variety of other conductive metal materials that would be apparent to one of skill in the art in possession of the present disclosure. For example, the heat dissipation cover 200 may be formed in the configuration illustrated and discussed below using a variety of metal-forming techniques (e.g., embossing techniques, etc.). However, while discussed as being provided by a conductive metal material and formed utilized particular metal-forming techniques, one of skill in the art in possession of the present disclosure will appreciate that other conductive materials (e.g., carbon fiber materials, conductive polymers, etc.) may be used to provide the heat dissipation cover 200 via other forming techniques (e.g., extrusion techniques, molding techniques, machining techniques, etc.) while remaining within the scope of the present disclosure as well.

In many of the examples provided below, the heat dissipation cover 200 includes a base wall 202 having an outer surface 202a and an inner surface 202b that is located opposite the base wall 202 from the outer surface 202a, along with a plurality of side walls 204 that extend from the perimeter of the base wall 202 in a substantially perpendicular orientation relative to the base wall 202 in order to define a component housing 206 between the base wall 202 and the plurality of side walls 204. As will be appreciated by one of skill in the art in possession of the present disclosure, the orientation of the plurality of sides walls 204 relative to the base wall 202 may be perpendicular or substantially perpendicular in order to define the component housing 206, but also may include other orientations that one of skill in the art in possession of the present disclosure would recognize as defining a component housing with a volume that is sufficient to house a heat producing component utilized in a variety of implementations of the heat dissipation wall system of the present disclosure.

In the illustrated embodiment, a plurality of coupling features 208a and 208b extend from at least some of the side walls 204 on the heat dissipation cover 200, and are configured to secure the heat dissipation cover 200 to a computing module chassis, discussed in further detail below. As such, while specific coupling features 208a and 208b for the heat dissipation cover 200 are illustrated and described, one of skill in the art in possession of the present disclosure will appreciate that any of a variety of coupling features may be provided on the heat dissipation cover while remaining within its scope. Furthermore, while not illustrated or discussed in detail below, in other embodiments any or all of the side walls 204 may define side wall airflow apertures that extend through the side walls 204 to the component housing 206 in order to, for example, allow airflow that is provided adjacent the side walls 204 to move through those side wall airflow apertures and into the component housing 206.

The heat dissipation cover 200 of the present disclosure includes a plurality of heat dissipation channels that are defined by the base wall 202 and that extend into the base wall 202 from the outer surface 202a, with each of those heat dissipation channels including a respective first airflow aperture that extends through the base wall 202 from the outer surface 202a to the component housing 206 such that an airflow that is provided adjacent the outer surface 202a of the base wall 202 may enter the component housing 206, and a respective second airflow aperture that is spaced apart from the first airflow aperture, that extends through the base wall 202 from the outer surface 202a to the component housing 206 such that an airflow that is provided adjacent the outer surface 202a of the base wall 202 may enter the component housing 206.

For example, with reference to the embodiment illustrated in FIGS. 2A, 2B, and 2C, the heat dissipation cover 200 includes a plurality of heat dissipation channels 210 that are each provided in a linear configuration and oriented substantially parallel to the other heat dissipation channels 210, with each heat dissipation channel 210 including a respective first airflow aperture 210a that is located on a first end of each heat dissipation channel 210 that is adjacent a side wall 204, that extends through the base wall 202 from the outer surface 202a to the component housing 206, and that is configured to allow an airflow that is provided adjacent the outer surface 202a to enter the component housing 206, as discussed in further detail below. Each of the heat dissipation channels 210 also include a respective second airflow aperture 210b that is spaced apart from the first airflow aperture 210a and located on a second end of each heat dissipation channel 210 that is opposite the first end of that heat dissipation channel 210 such that each respective second airflow aperture 210b is adjacent a side wall 204, that extends through the base wall 202 from the outer surface 202a to the component housing 206, and that is configured to allow an airflow that is provided adjacent the outer surface 202a to enter the component housing 206. For example, FIG. 2C illustrates a cross-section of the heat dissipation cover 200 that shows the second airflow apertures 210b, and one of skill in the art in possession of the present disclosure will recognize how the first airflow apertures 210a appears substantially similar to the second airflow apertures 210b in cross-section as well.

As will be appreciated by one of skill in the art in possession of the present disclosure, the heat dissipation channels 210 operate to increase the surface area of the base wall 202 (i.e., relative to the base wall 202 without the heat dissipation channels 210), and the linear configuration illustrated in FIGS. 2A-2C has been found to provide a 24% increase in surface area relative to the base wall 202 without any heat dissipation channels, although one of skill in the art in possession of the present disclosure will appreciate that heat dissipation walls (i.e., like the base wall 202) having different configurations may experience larger or smaller changes in surface area via the techniques of the present disclosure while remaining within its scope. However, while a specific configuration and relative orientation of the heat dissipation channels 210, first airflow apertures 210a, and second airflow apertures 210b is illustrated and described, one of skill in the art in possession of the present disclosure will appreciate that different configurations and relative orientations of the heat dissipation channels, first airflow apertures, and second airflow apertures will fall within the scope of the present disclosure as well. For example, in some embodiments, features may be added to the outer surface 202a or inner surface 202b of the base wall 202, and/or the heat dissipation channels 210, in order to create a turbulent airflow that one of skill in the art in possession of the present disclosure will recognize operates to increase heat transfer from the base wall 202/heat dissipation channels 210.

Figure 3:
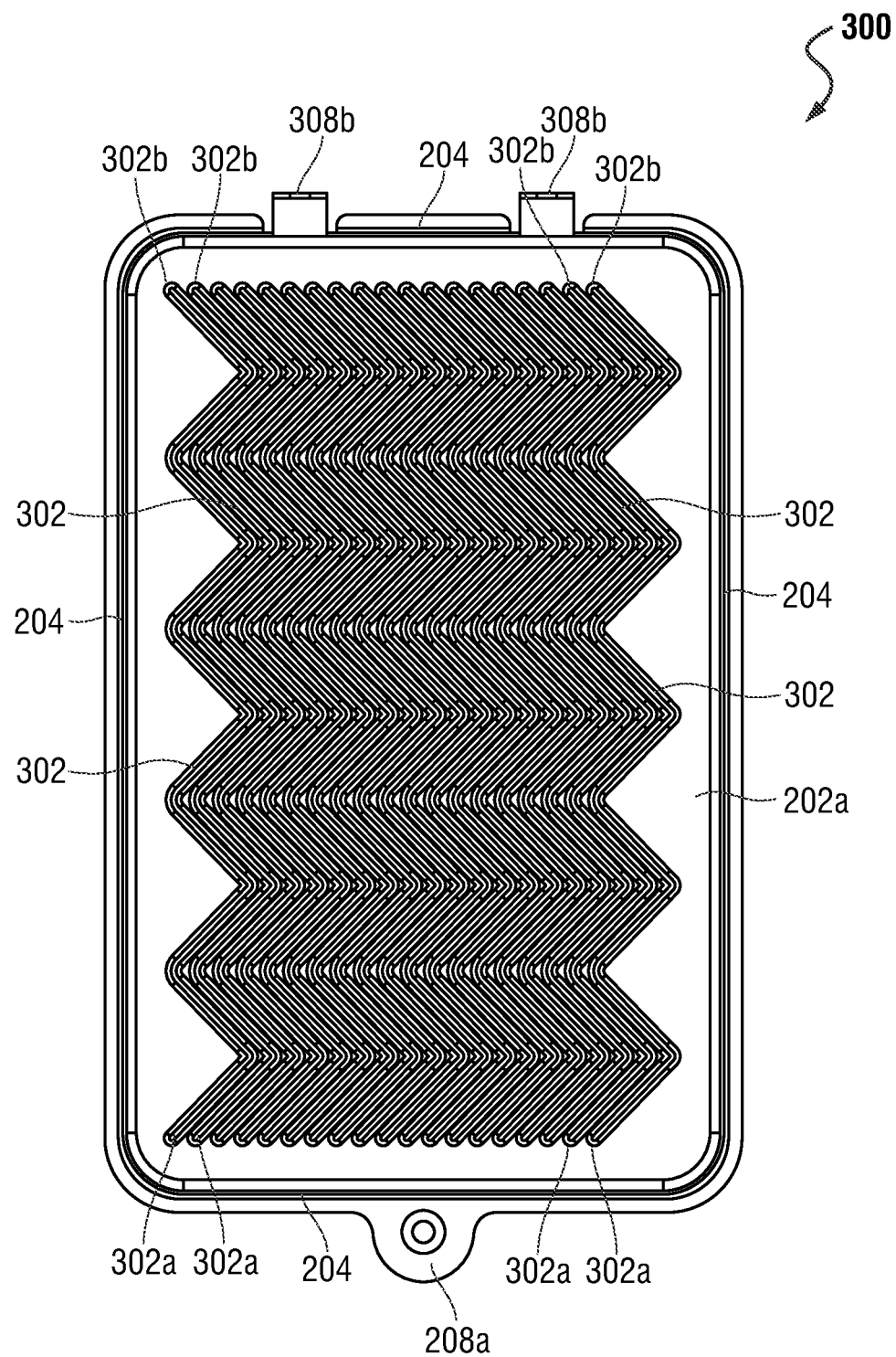
FIG. 3 is a top view illustrating an embodiment of a heat dissipation cover that may be utilized in the heat dissipation wall system of the present disclosure.

For example, with reference to FIG. 3, an embodiment of a heat dissipation cover 300 is illustrated that is substantially similar to the heat dissipation cover 300 (and thus includes similar element numbers for similar features), but with modified heat dissipation channels 302. As discussed below, in some embodiments, the heat dissipation channels 302 provided on the heat dissipation cover 300 may be provided in a patterned configuration and may be oriented substantially parallel to the other heat dissipation channels. For example, as can be seen in FIG. 3, the plurality of heat dissipation channels 302 on the heat dissipation cover 300 each includes multiple sections that are provided in an angular configuration relative to each other (e.g., in a "zig-zag" pattern in this embodiment), and are oriented substantially parallel to the other heat dissipation channels 302, with each heat dissipation channel 302 including a respective first airflow aperture 302a that is located on a first end of each heat dissipation channel 302 that is adjacent a side wall 204, that extends through the base wall 202 from the outer surface 202a to the component housing 206, and that is configured to allow an airflow that is provided adjacent the outer surface 202a to enter the component housing 206, similarly to the heat dissipation cover 200 that is discussed in further detail below. Each of the heat dissipation channels 302 also include a respective second airflow aperture 302b that is spaced apart from the first airflow aperture 302a and located on a second end of each heat dissipation channel 302 that is opposite the first end of that heat dissipation channel 302 such that each respective second airflow aperture 302b is adjacent a side wall 204, that extends through the base wall 202 from the outer surface 202a to the component housing 206, and that is configured to allow an airflow that is provided adjacent the outer surface 202a to enter the component housing 206.

As will be appreciated by one of skill in the art in possession of the present disclosure, the patterned configuration illustrated for the heat dissipation cover 300 of FIG. 3 provides an increase in surface area provided by the heat dissipation channels 302 on the base wall 202 relative to the heat dissipation channels 210 on the base wall 202 of the heat dissipation cover 200 of FIGS. 2A-2C (e.g., a 27% increase in surface area relative to the base wall 202 without the heat dissipation channels), and a variety of different patterns for the heat dissipation channels of the present disclosure may be utilized in order to provide a desired level of heat transfer from the heat producing component(s) discussed in further detail below. For example, the heat dissipation channels 210 on the heat dissipation cover 200 illustrated in FIGS. 2A-2C may be considered "vertical" heat dissipation channels, and that heat dissipation cover 200 may also be provided with "horizontal" heat dissipation channels that are substantially perpendicular to the "vertical" heat dissipation channels in order to provide a "grid" of heat dissipation channels on the heat dissipation cover 200 that further increase the surface area provided by the heat dissipation channels of the present disclosure.

Furthermore, the provisioning of the first airflow apertures 210a/302a and second airflow apertures 210b/302b on opposite ends of the heat dissipation channels 210/302 such that they are located adjacent opposing side walls 204 on the heat dissipation cover 200/300 may be modified by, for example, providing airflow apertures at locations along the length of a heat dissipation channel. In one embodiment, with reference to the heat dissipation cover 200, an airflow aperture may be provided midway between the first airflow aperture 210a and the second airflow aperture 210b. Similarly, with reference to the heat dissipation cover 300, airflow aperture(s) may be provided along the length of the heat dissipation channels 302 such as, for example, at the "bend" in those heat dissipation channels where an angle is provided between two sections of those heat dissipation channels. As such, while several specific examples are described, one of skill in the art in possession of the present disclosure will recognize that the heat dissipation channels and the airflow apertures provided with those heat dissipation channels may be modified in a variety of manners relative to that illustrated and described below while remaining within the scope of the present disclosure as well.

Furthermore, as discussed above, the heat dissipation wall system of the present disclosure may provide a heat dissipation wall including heat dissipation channels on a chassis wall of a computing device (i.e., rather than on the base wall 202 of the heat dissipation cover 200). For example, a chassis wall of a chassis provided on laptop/notebook computing device or a desktop computing device may be provided with heat dissipation channels according to the teachings of the present disclosure in order to providing cooling for components on a circuit board (e.g., a motherboard) that is housed in that chassis. As such, the heat dissipation wall system of the present disclosure may be provided in a variety of different systems and devices while remaining within the scope of the present disclosure as well.

Figure 4A:
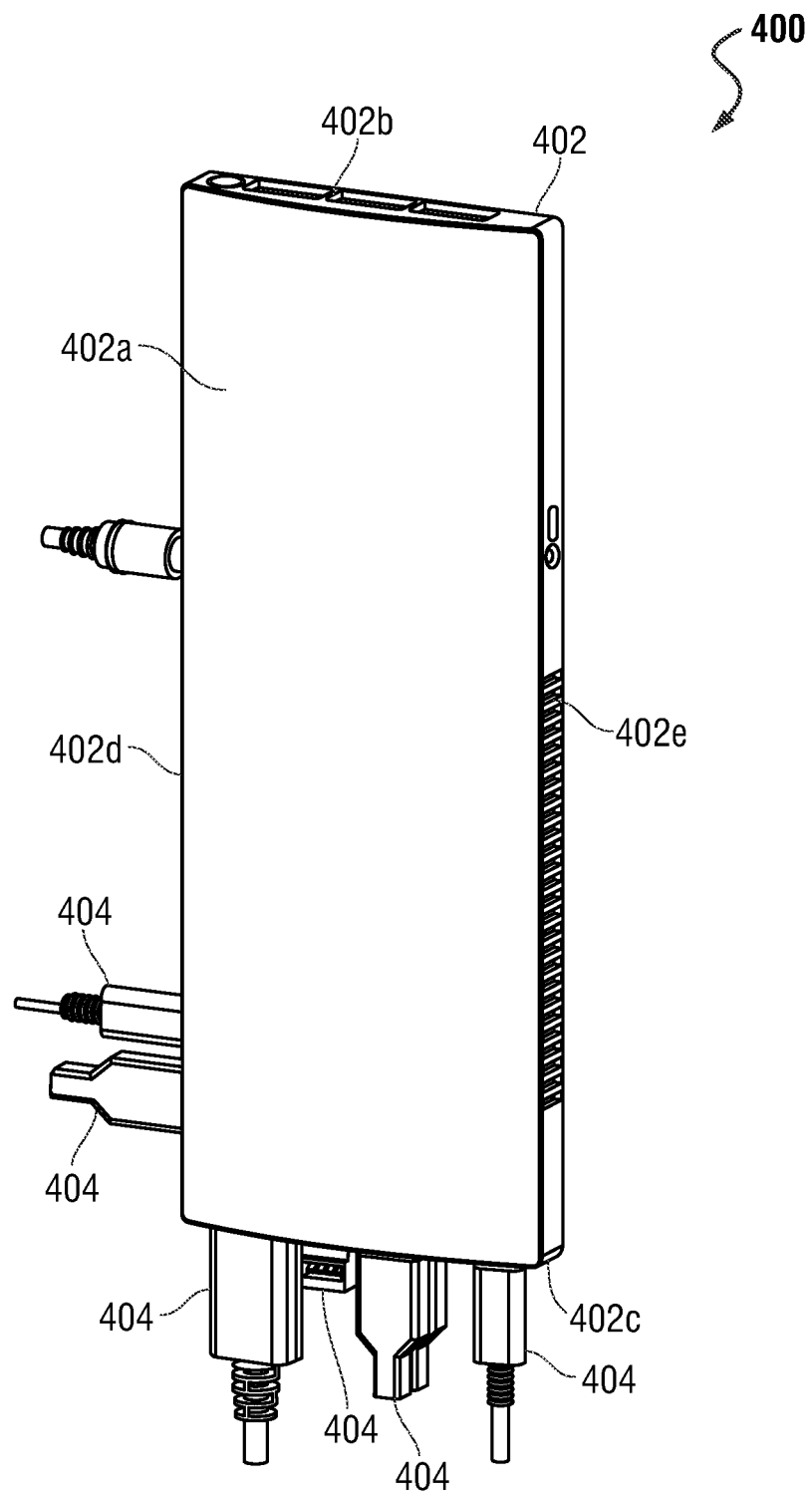
FIG. 4A is a front perspective view illustrating an embodiment of a computing device to which the heat dissipation cover of FIGS. 2A-2B may be coupled to provide the heat dissipation wall system of the present disclosure.
Figure 4B:
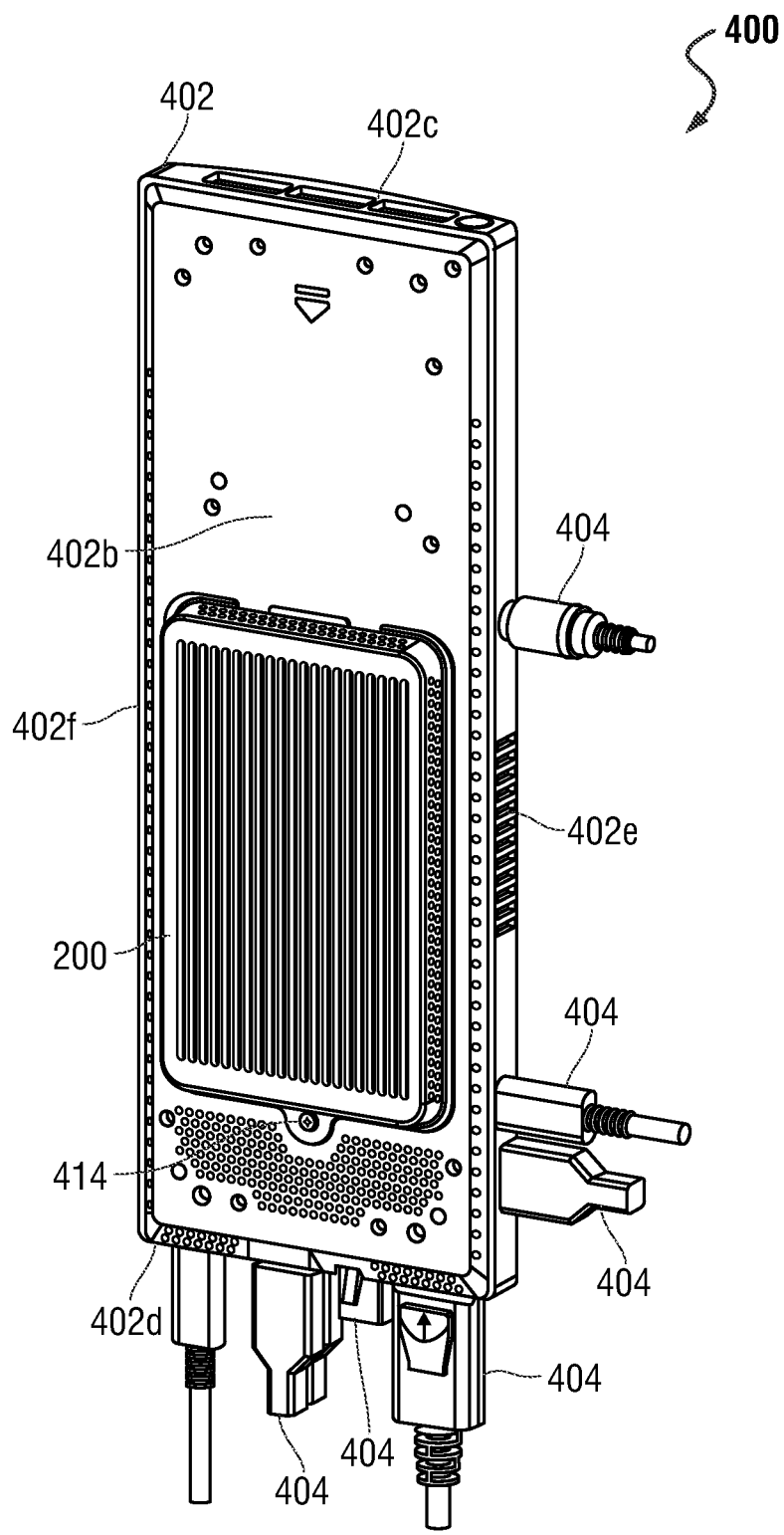
FIG. 4B is a rear perspective view illustrating an embodiment of the computing device of FIG. 4A.

Referring now to FIGS. 4A and 4B, an embodiment of a computing device 400 is illustrated that may utilize the heat dissipation wall system of the present disclosure. In the illustrated embodiment and the examples below, the computing device 400 provides a computing module that may be utilized in a desktop computing device such as those included in the OPTIPLEX® family of desktop computing devices available from DELL® Inc. of Round Rock, Tex., United States. As such, the computing device 400 may be provided by the IHS 100 discussed above with reference to FIG. 1, and/or may include some or all of the components of the IHS 100. However, while illustrated and discussed as a computing device 400 that provides a computing module for a desktop computing device, one of skill in the art in possession of the present disclosure will recognize that heat dissipation wall system of the present disclosure may be provided with any heat producing components in a variety of computing devices that will fall within the scope of the present disclosure as well.

In the illustrated embodiment, the computing device 400 includes a chassis 402 that houses the components of the computing device 400, only some of which are discussed below. The chassis includes a front surface 402a, a rear surface 402b that is located opposite the chassis 402 from the front surface 402a, a top edge 402c extending from the front surface 402a and the rear surface 402b, a bottom edge 402d that is located opposite the chassis 402 from the top edge 402c and that extends between the front surface 402a and the rear surface 402b, and a pair of opposing side edges 402e and 402f that are located opposite the chassis 402 from each other and that extend between the front surface 402a, the rear surface 402b, the top edge 402c, and the bottom edge 402d. As illustrated, the chassis 402 may include airflow apertures on any or all of the top edge 402c, the bottom edge 402d, and/or the side edges 402d and 402e, which as discussed below may allow an airflow adjacent those edges 402c, 402d, 402e, and/or 402f to enter a chassis housing defined by the chassis 402. Furthermore, as illustrated, the chassis 402 may also include connectors on any or all of the top edge 402c, the bottom edge 402d, and/or the side edges 402e and 40fe that are configured to connect to cabling 404 (e.g., when the computing device 400 is positioned in a display stand as discussed below) that couples the computing device 400 to other computing components.

Figure 4C:
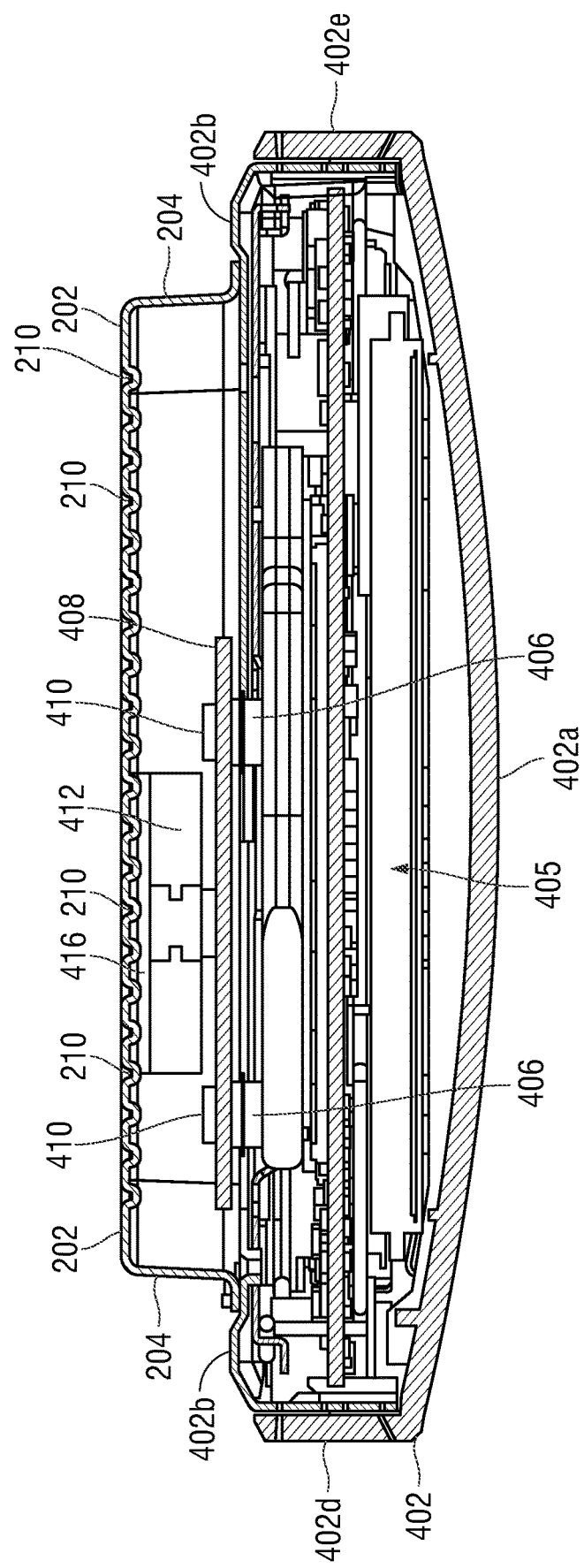
FIG. 4C is a cross-sectional view illustrating an embodiment of the computing device of FIGS. 4A and 4B.

As illustrated in FIG. 4C, the chassis 402 defines a chassis housing 405 that houses the components of the computing device 400 that are not described in detail with element numbers, but that may include circuit boards, processing systems, memory systems, storage systems, communication systems, and/or any other computing device components that would be apparent to one of skill in the art in possession of the present disclosure. Furthermore, the computing device 400 of FIGS. 4A-4C also includes mounting elements 406 and an electrical connector (not clearly visible in FIG. 4C) that may provide an "option bay" or other features for enabling the connection of a heat producing device adjacent to the rear surface 402b of the chassis 402 on the computing device 400 (e.g., via the mounting elements 406). In the examples below, the heat producing component mounted adjacent to the rear surface 402b of the chassis 402 and connected to the computing device components in the chassis 402 (e.g., via the electrical connector discussed above) is provided by a storage device (e.g., a Solid State Drive (SSD)), although one of skill in the art in possession of the present disclosure will recognize that a wide variety of heat producing components may be coupled to the computing device 400 while remaining within the scope of the present disclosure as well.

As such, with reference to FIG. 4C, a circuit board 408 may be connected to the computing device components in the chassis 402 via the electrical connector discussed above, and the circuit board 408 (e.g., an expansion card) may be connected to the electrical connector on the computing device 400, and may be secured to the chassis 402 via securing elements 410 (e.g., screws) that engage the mounting elements 406 or other mounting features in the chassis 402. A heat producing component 412 provided by, for example, an M.2 SSD, may be mounted to the circuit board 408 (e.g., connected to a connector on the expansion card) such that is coupled to the computing device components in the chassis 402 via the connection of the circuit board 408 to the electrical connector discussed above. However, while a specific configuration for a heat producing component is illustrated and described below, one of skill in the art in possession of the present disclosure will appreciate that the heat dissipation wall system of the present disclosure may be utilized with a variety of heat producing components that may be provided in a variety of configurations while remaining within the scope of the present disclosure as well. For example, as discussed above, the heat dissipation wall system of the present disclosure may be utilized on a chassis wall of a chassis provided on laptop/notebook computing device or desktop computing device, and a heat producing component (e.g., a processing system) on a motherboard in that chassis may operate in a substantially similar manner to the heat producing component 412 described herein.

As illustrated in FIGS. 4B and 4C, the heat dissipation cover 200 discussed above with reference to FIGS. 2A-2C may be secured to the rear surface 402b of the chassis 402 such that the heat producing component 412 is positioned in the component housing 206 by, for example, engaging the coupling features 208b on the heat dissipation cover 200 with the corresponding coupling features on the rear surface 402b of the chassis 402, and providing a securing element 414 (e.g., a screw) that engages the coupling feature 208a on the heat dissipation cover 200 and a corresponding coupling feature on the rear surface 402b of the chassis 402. Furthermore, as can be seen in FIG. 4C, a thermal interface material 416 (e.g., a thermal pad) may be provided between the heat producing component 412 and the base wall 202/heat dissipation channels 210 such that the thermal interface material 416 engages a top surface of the heat producing component 412 and the inner surface 202b of the base wall 202/heat dissipation channels 210. For example, the thermal interface material 416 may be adhered to the heat producing component 412, followed by the securing of the heat dissipation cover 200 to the rear surface 402b of the chassis 402, which operates to compress the thermal interface material 416 between the heat producing component 412 and the base wall 202/heat dissipation channels 210 on the heat dissipation cover 200, causing the thermal interface material 416 to enter the heat dissipation channels 210 and increase the surface area between the thermal interface material 416 and the base wall 202, thus improving heat transfer from the thermal interface material 416 to the base wall 202.

However, while a thermal interface material provided by a thermal pad is described as being provided between the heat producing component 412 and the base wall 202/heat dissipation channels 210 on the heat dissipation cover 200, other heat transfer couplings may be utilized while remaining within the scope of the present disclosure as well. For example, for relatively large spacing between the heat producing component 412 and the base wall 202 (e.g., 1.6 mm in the embodiment illustrated herein) the thermal interface material provided by the thermal pad may be utilized, while for relatively smaller spacings between the heat producing component 412 and the base wall 202a a thermal interface material provided by a thermal paste may be utilized. However, while a specific computing device/heat producing component/heat dissipation wall system configuration has been described, one of skill in the art in possession of the present disclosure will recognize that the heat dissipation wall system of the present disclosure may include a variety of components and component configurations while remaining within the scope of the present disclosure as well.

Figure 5A:
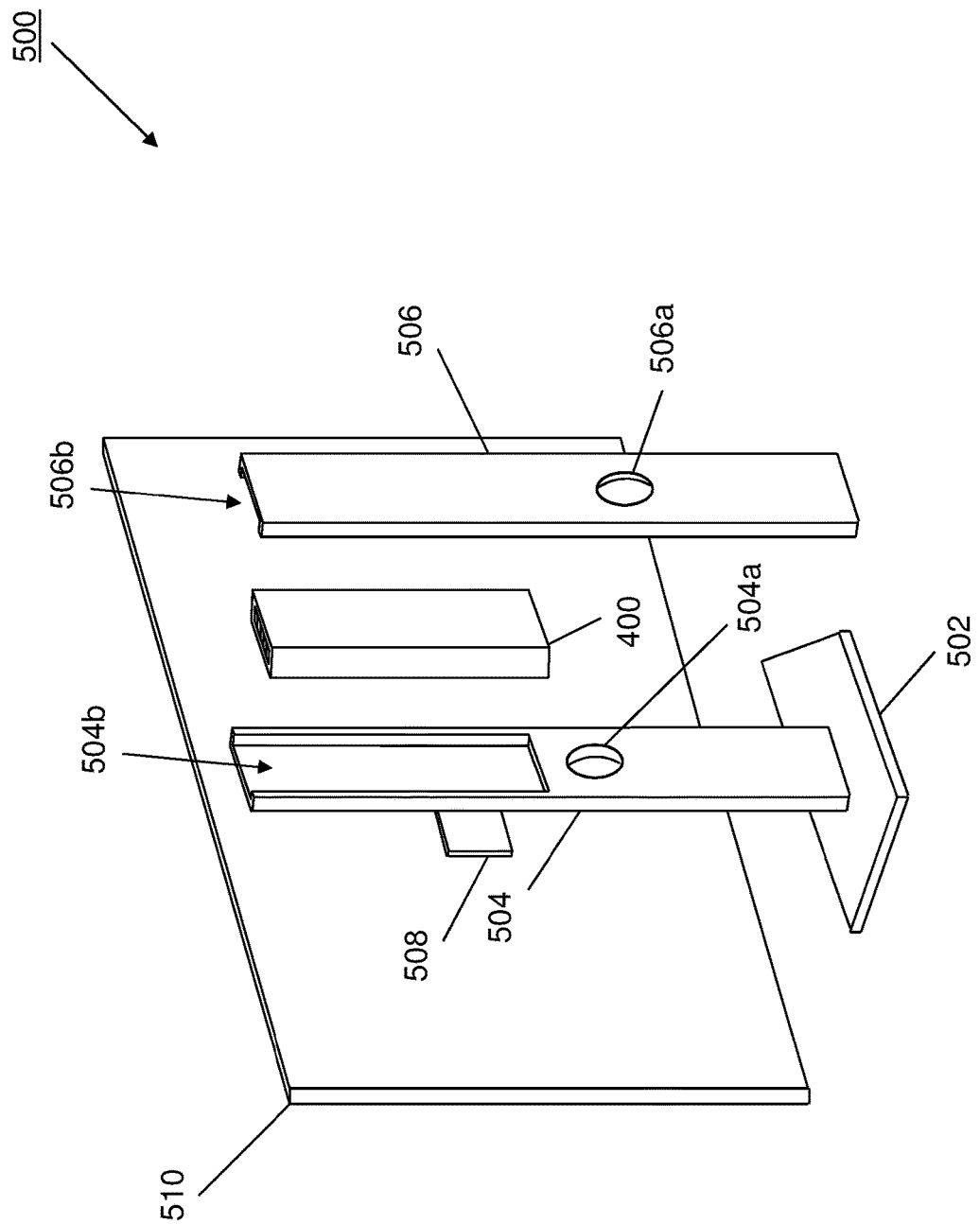
FIG. 5A is an exploded perspective view illustrating an embodiment of the computing device of FIGS. 4A-4C being provided in a display stand.
Figure 5B:
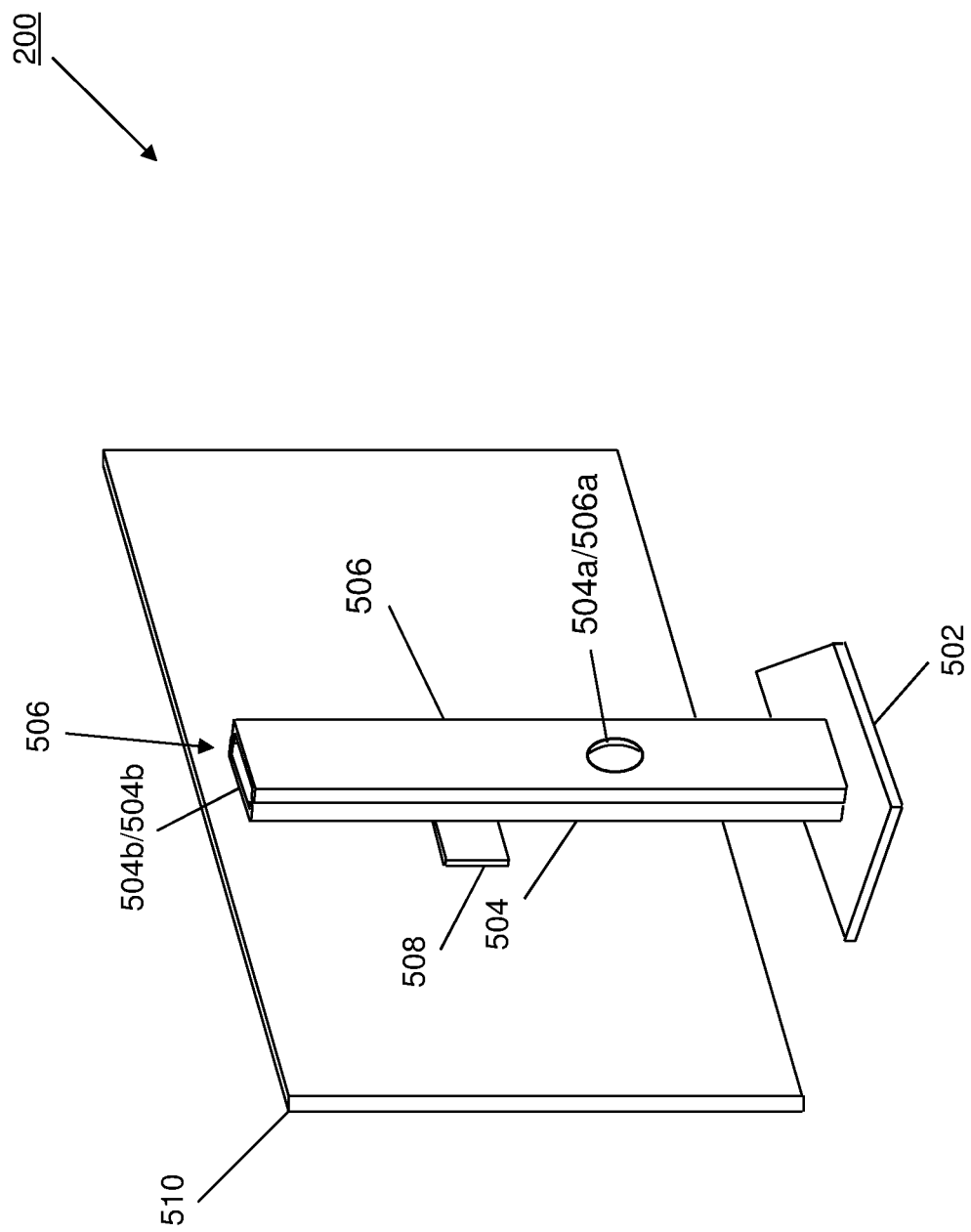
FIG. 5B is a perspective view illustrating an embodiment of the computing device of FIGS. 4A-4C provided in a display stand.

Referring now to FIGS. 5A, 5B, 5C, and 5D, in some embodiments the computing device 400 including the heat dissipation cover 200 illustrated in FIGS. 4A-4C may then be provided in a display stand. Some of the inventors of the present disclosure describe the coupling of a computing device to a display stand in U.S. patent application Ser. No. 16/946,641), filed on Jun. 30, 2020, the disclosure of which is incorporated herein by reference in its entirety. In the example illustrated in FIGS. 5A and 5B, a display system 500 may include a base 502. A display stand 504 may extend from the base 502, may define a first portion of an airflow/cable routing aperture 504a, and may include a display stand riser that defines a first portion of a computing device housing 504b. Furthermore, a display stand cover 506 is provided that defines a second portion of an airflow/cable routing aperture 506a, that defines a second portion of a computing device housing 506b, and that is configured to couple to the display stand 504. However, while the illustrated embodiment includes the display stand cover 506 coupling to the display stand 504 to provide a computing device housing (e.g., provided by the first portion of the computing device housing 504b and the second portion of the computing device housing 506b), one of skill in the art in possession of the present disclosure will appreciate that the computing device housing illustrated and discussed below may be provided by an integrated/1-piece display stand that defines that computing device housing while remaining within the scope of the present disclosure as well. As can be seen in FIGS. 5A and 5B, a display mount 508 extends from the display stand 504, and a display 510 is mounted to the display mount 508.

Figure 5C:
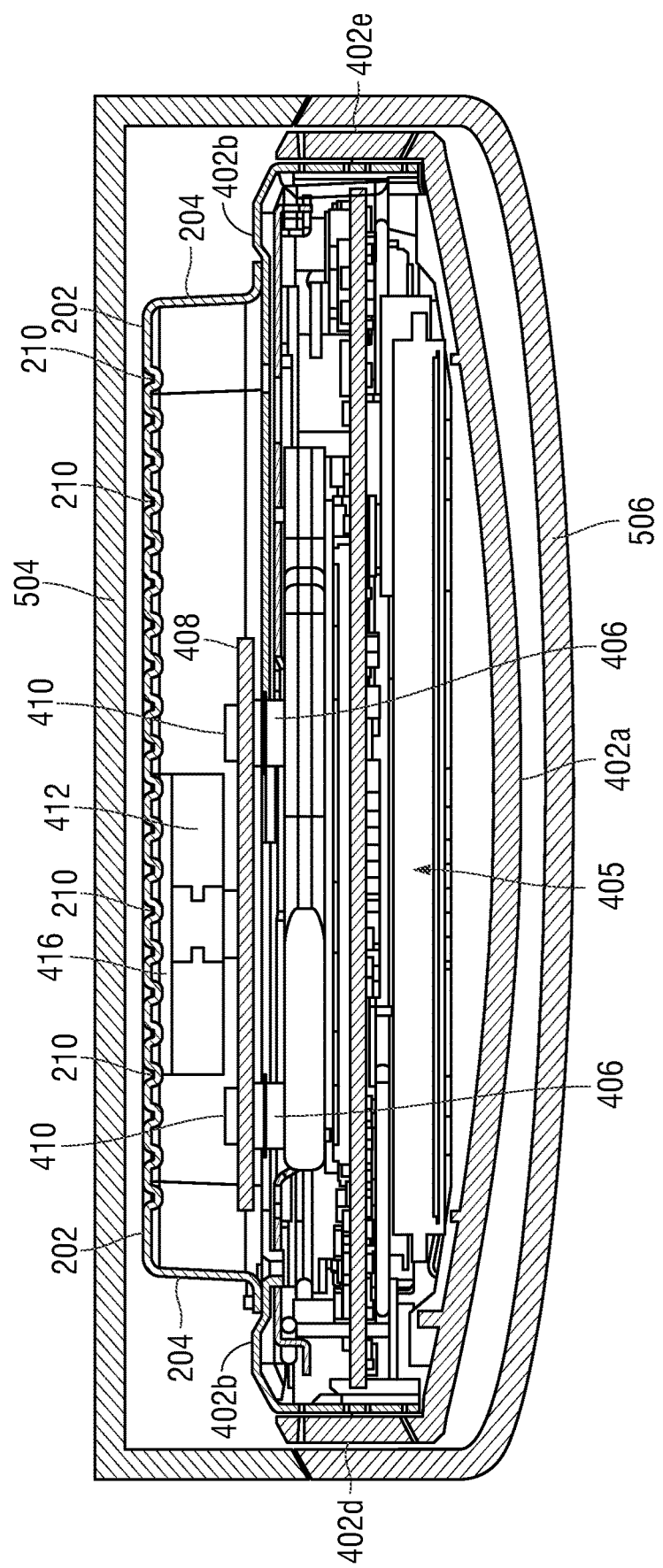
FIG. 5C is a cross-sectional view illustrating an embodiment of the computing device of FIGS. 5A and 5B provided in the display stand.

As illustrated in FIGS. 5A and 5B, the computing device 400 (e.g., with the heat dissipation cover 200 secured thereto, not visible in FIG. 5A) may be positioned in the computing device housing (e.g., provided by the first portion of the computing device housing 504b and the second portion of the computing device housing 506b when the display stand cover 506 is coupled to the display stand 504) and, while not illustrated in FIGS. 5A-5D, may be coupled to the display 510 and/or other computing device components via, for example, the cabling 404 illustrated and discussed above with reference to FIGS. 4A and 4B. As illustrated in FIG. 5C, with the computing device 400 positioned in the computing device housing that is provided by the first portion of the computing device housing 504b and the second portion of the computing device housing 506b when the display stand cover 506 is coupled to the display stand 504, the outer surface 202a of the base wall 202 is located adjacent to and spaced apart from the display stand 504 (and/or components on the display stand 504). For example, in desktop computing devices such as those included in the OPTIPLEX® family of desktop computing devices available from DELL® Inc. of Round Rock, Tex., United States, the spacing between the outer surface 202a of the base wall 202 and the display stand 504 (and/or components on the display stand 504) may be approximately 1 mm, thus providing a limited airflow channel in the computing device housing between the heat dissipation cover 200 and the display stand 504.

Figure 5D:
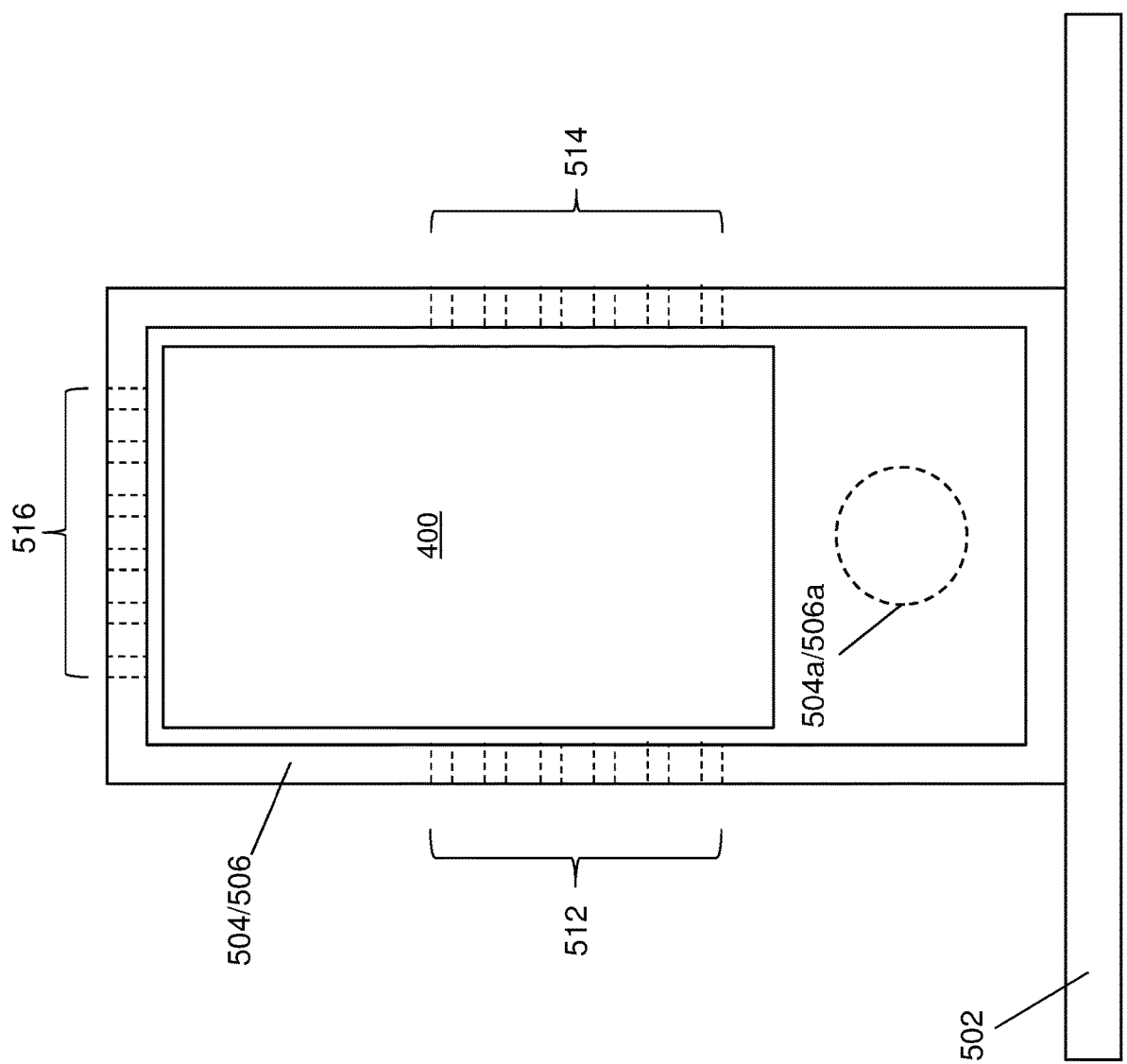
FIG. 5D is a schematic view illustrating an embodiment of the computing device of FIGS. 5A and 5B provided in the display stand.

With reference to FIG. 5D, a schematic view is illustrated of the computing device 400 (e.g., with the heat dissipation cover 200 secured thereto, not visible in FIG. 5D) positioned in the computing device housing provided by the first portion of the computing device housing 504b and the second portion of the computing device housing 506b when the display stand cover 506 is coupled to the display stand 504. As can be seen in FIG. 5D, the coupled-together display stand 504 and/or the display stand cover 506 may include a bottom airflow/cable routing aperture that is provided by the airflow/cable routing apertures 504a and 506a and that provides an airflow path to the computing device housing defined by the display stand 504/display stand cover 506, side airflow apertures 512 and 514 that provide airflow paths to the computing device housing defined by the display stand 504/display stand cover 506, and a top airflow aperture 516 that provides an airflow path from the computing device housing defined by the display stand 504/display stand cover 506. However, while a specific example is illustrated in FIG. 5D, one of skill in the art in possession of the present disclosure will appreciate that the display stand that houses the computing device 400 may provide airflow paths past that computing device 400 in a variety of manners that will fall within the scope of the present disclosure as well.

Figure 6:
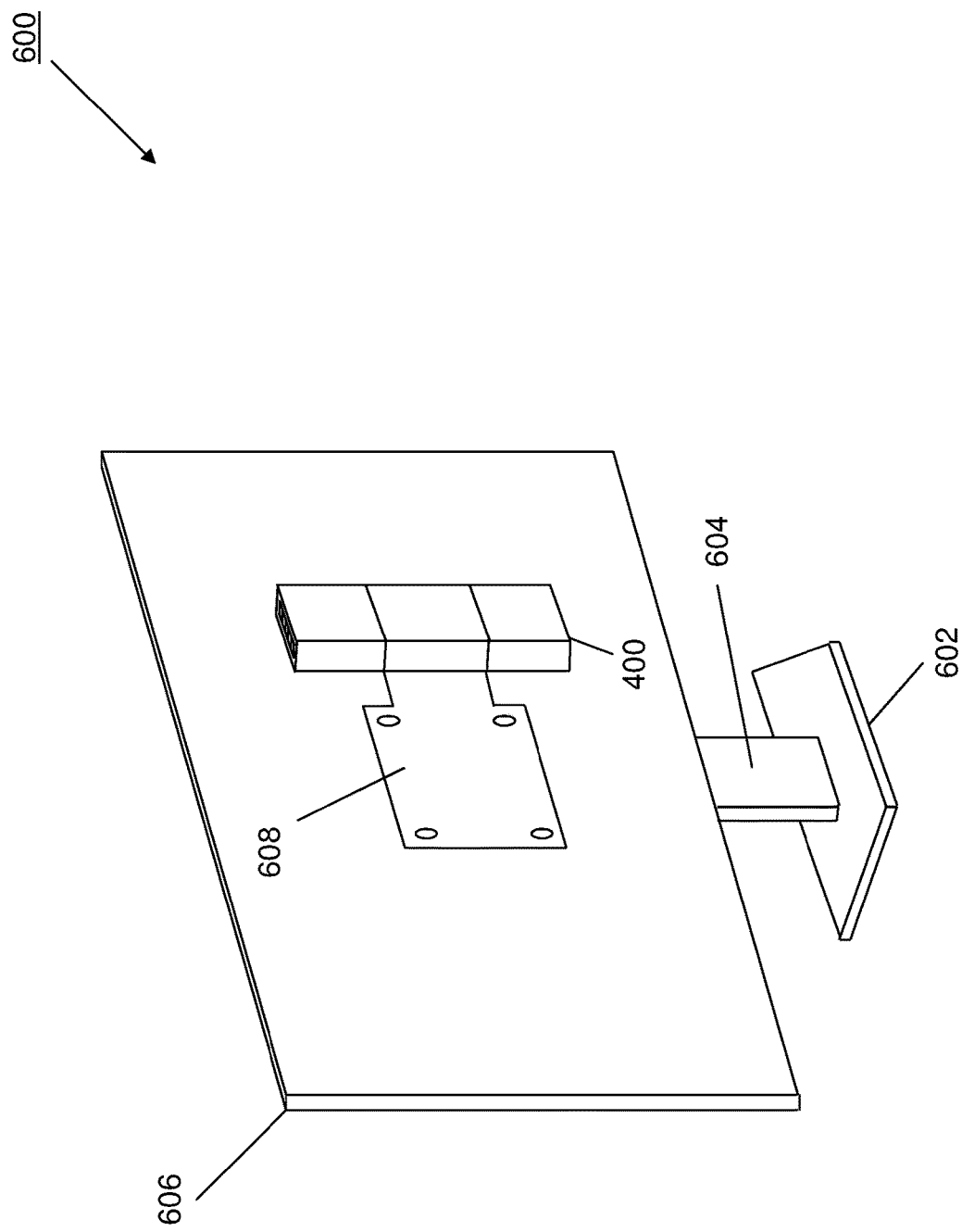
FIG. 6 is a perspective view illustrating an embodiment of the computing device of FIGS. 4A-4C mounted to a display.

Furthermore, while the computing device 400 with the heat dissipation cover 200 secured thereto is illustrated and discussed as being positioned within a display stand, the computing device 400 with the heat dissipation cover 200 secured thereto may be provided in other manners that will fall within the scope of the present disclosure as well. For example, with reference to FIG. 6, a display system 600 is illustrated that includes a base 602, a display stand 604 extending from the base 602, and a display 606 that is mounted to the display stand 604. As illustrated, a computing device bracket 608 may be mounted to the display 606 (e.g., via a Video Electronics Standards Association (VESA) mounting system), and the computing device 400 may be mounted to the computing device bracket 608 (with the heat dissipation cover 200 (not visible in FIG. 6) located between the computing device 400 and the monitor 606. Furthermore, some of the inventors of the present disclosure describe the coupling of a computing device to a computing device bracket in U.S. patent application Ser. No. 16/946,535), filed on Jun. 25, 2020, the disclosure of which is incorporated herein by reference in its entirety. As such, one of skill in the art in possession of the present disclosure will appreciate that the heat dissipation wall system of the present disclosure may be provided to dissipate heat in a wide variety of configurations that will fall within the scope of the present disclosure as well.

Figure 7:
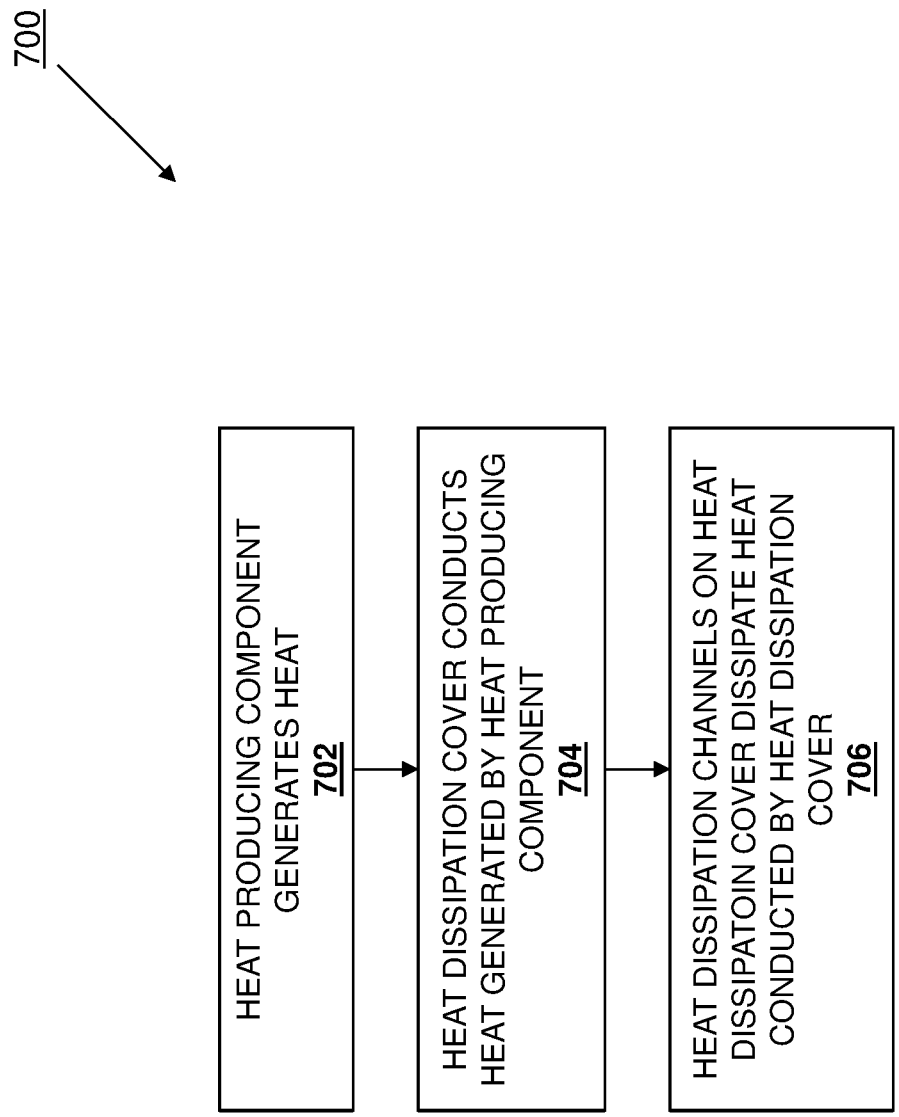
FIG. 7 is a flow chart illustrating an embodiment of a method for dissipating heat.

Referring now to FIG. 7, an embodiment of a method 700 for dissipating heat is illustrated. As discussed below, the systems and methods of the present disclosure provide for the dissipation of heat generated by a heat producing component by conducing that heat using a heat dissipation cover that is coupled to the heat producing component and that includes a base wall having an outer surface, and a plurality of side walls extending approximately perpendicularly from the base wall in order to define a component housing between the base wall and the plurality of side walls that houses the heat producing component. A plurality of heat dissipation channels are defined by the base wall and extend into the base wall from the outer surface, and each heat dissipation channel includes a respective first airflow aperture that extends through the base wall from the outer surface to the component housing and that allows an airflow that is provided adjacent the outer surface to enter the component housing to dissipate the heat generated by the heat producing component, and a respective second airflow aperture that is spaced apart from the first airflow aperture, that extends through the base wall from the outer surface to the component housing, and that allows an airflow that is provided adjacent the outer surface to enter the component housing to dissipate the heat generated by the heat producing component. Some experimental embodiments of the heat dissipation cover of the present disclosure have been found to produce 8-degree Celsius reductions in temperature of heat producing components relative to conventional components covers, thus providing for efficient heat dissipation in relatively small computing device housings.

Figure 8A:
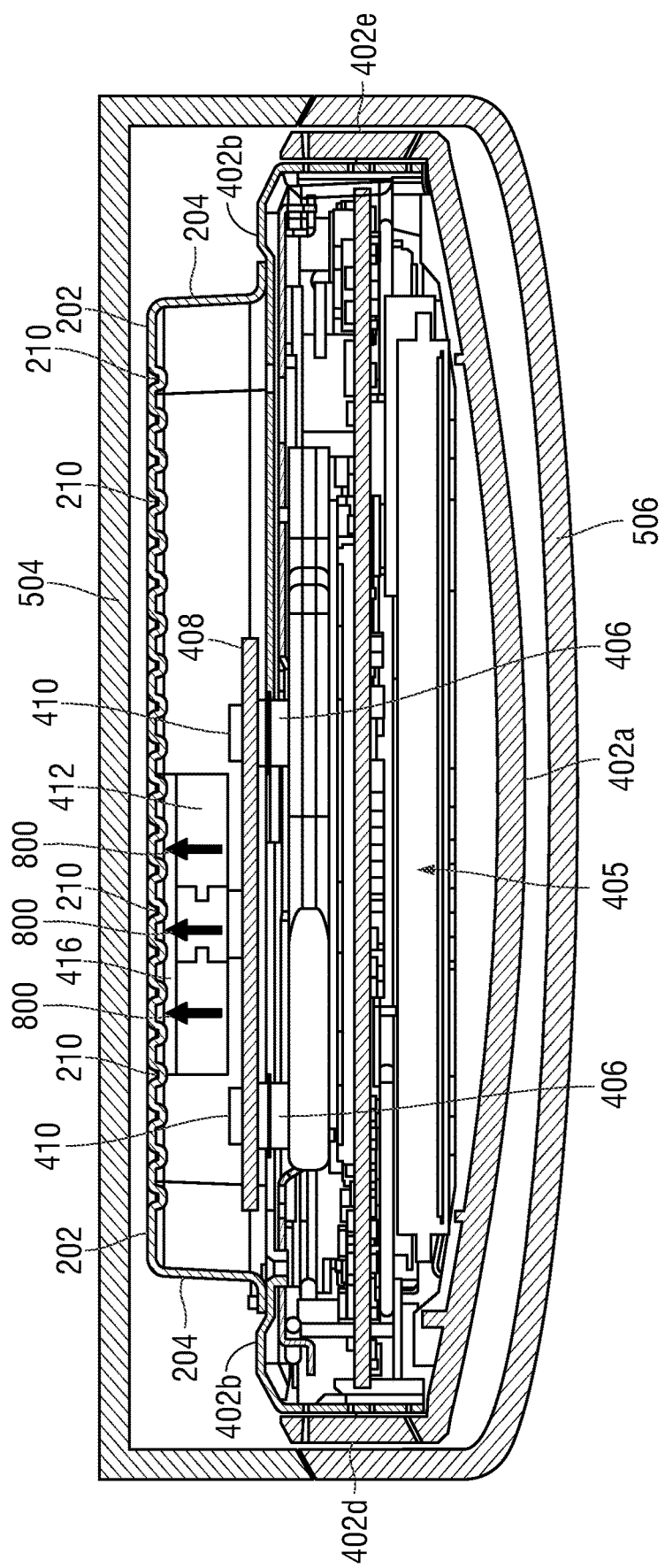
FIG. 8A is a cross-sectional view illustrating an embodiment of the operation of the heat dissipation wall system provided by the computing device housed in the display stand as illustrated in FIG. 5C.

The method 700 begins at block 702 where a heat producing component generates heat. In an embodiment, at block 702, the heat producing component 412 may operate to produce heat. For example, as discussed above, the heat producing component 412 may be an M.2 SSD that may be utilized at block 702 to store or retrieve data for the computing device 400, and one of skill in the art in possession of the present disclosure will appreciate how the operation of the M.2 SSD to store or retrieve data will generate heat. As illustrated in FIG. 8A, heat 800 generated by the operation of the heat producing component 412 will transfer to the thermal interface material 416 and towards the base wall 202 of the heat dissipation cover 200. As will be appreciated by one of skill in the art in possession of the present disclosure, the compression of the thermal interface material 416 between the base wall 202/heat dissipation channels 210 and the heat producing component 412 provides more compression and a higher compressive force on the portion of the thermal interface material 416 between the heat dissipation channels 210 and the heat producing component 412, which operates to increase the heat transfer between heat producing component 412 and the heat dissipation channels 210 relative to the heat transfer provided between the heat producing component 412 and the base wall 202. However, while the generation of heat by a particular heat producing component in a particular manner (e.g., the generation and transfer of heat to the thermal interface material 416) has been described, one of skill in the art in possession of the present disclosure will appreciate that a variety of heat producing components may generate and transfer heat to a variety of thermal subsystems (e.g., thermal paste) while remaining within the scope of the present disclosure as well.

The method 700 then proceeds to block 704 where a heat dissipation cover conducts the heat generated by the heat producing component. In an embodiment, at block 704, the base wall 202 and the heat dissipation channels 210 on the heat dissipation cover 200 will operate to conduct the heat 800 that was transferred by the thermal interface material 416 in response to the generation of that heat 800 by the heat producing component 412. As discussed above, the heat dissipation cover 200 may be fabricated using a conductive metal material (or other conductive materials), and one of skill in the art in possession of the present disclosure will recognize how such a material operates to conduct heat. Thus, the heat generated by the heat producing component 412 will be conducted at block 704 such that it is distributed across at least a portion of the base wall 202 and the heat dissipation channels 210.

The method 700 then proceeds to block 706 where heat dissipation channels on the heat dissipation cover dissipate the heat conducted by the heat dissipation cover. In an embodiment, at block 706, the heat generated by the head producing component 412 and conducted by the heat dissipation cover 200 may be dissipated by the heat dissipation channels 210 on the heat dissipation cover 200. While not discussed in detail below, at least a portion of the heat distributed across at least a portion of the base wall 202 and the heat dissipation channels 210 may be dissipated via radiative heat transfer. However, as discussed below, a majority of the heat distributed across at least a portion of the base wall 202 and the heat dissipation channels 210 may be dissipated via convective heat transfer to the environment using an airflow that, in the embodiment illustrated and discussed herein, may be generated in response to temperature variations rather than fan systems (e.g., which may occur initially due to the radiative heat transfer discussed above). However, one of skill in the art in possession of the present disclosure will appreciate that the heat dissipation wall system of the present disclosure may utilize fan systems to produce the airflows discussed below while remaining within the scope of the present disclosure as well.

Figure 8B:
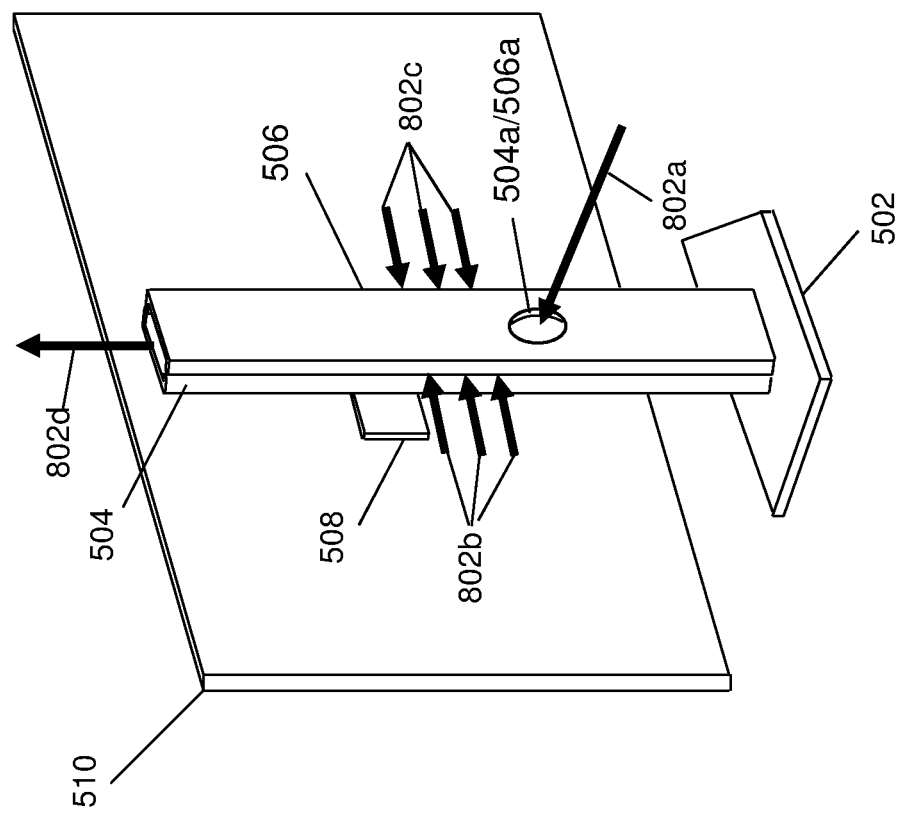
FIG. 8B is a perspective view illustrating an embodiment of the operation of the heat dissipation wall system provided by the computing device housed in the display stand as illustrated in FIG. 5B.
Figure 8C:
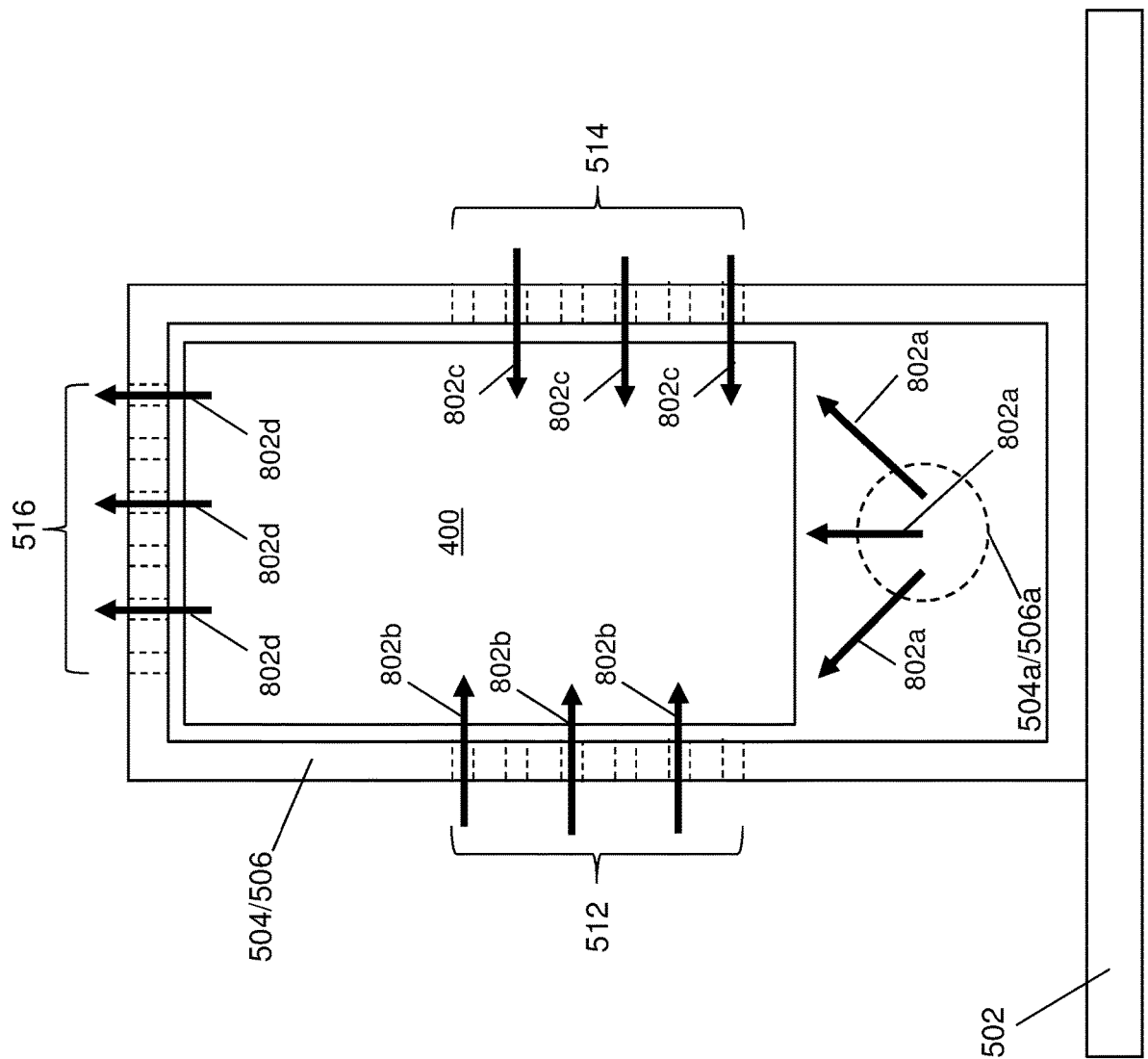
FIG. 8C is a schematic view illustrating an embodiment of the operation of the heat dissipation wall system provided by the computing device housed in the display stand.
Figure 8D:
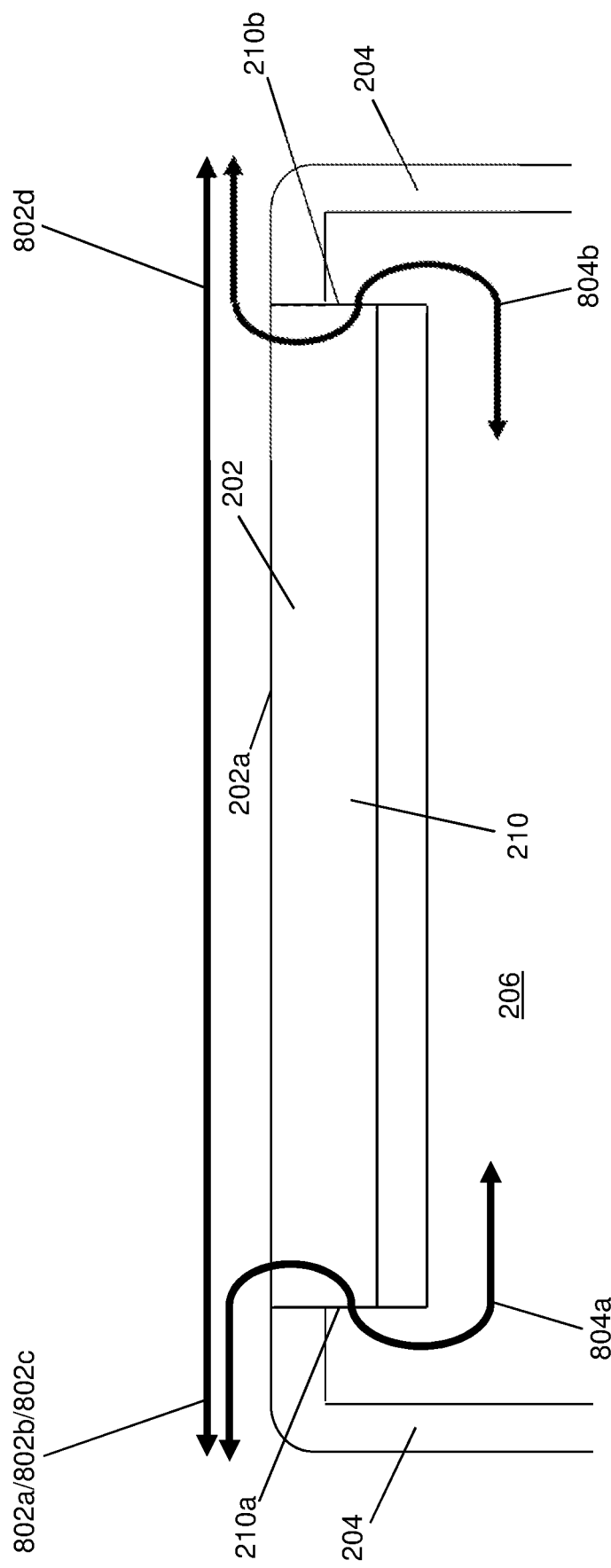
FIG. 8D is a schematic view illustrating an embodiment of the operation of the heat dissipation wall system provided by the computing device housed in the display stand as illustrated in FIGS. 5A-5D.

As illustrated in FIGS. 8B and 8C, the temperature variations in the computing device housing defined by the display stand system 500 may produce an airflow 802a that enters the computing device housing defined by the display stand system 500 via the bottom airflow/cable routing aperture that is provided by the airflow/cable routing apertures 504a and 506a, an airflow 802b that enters the computing device housing defined by the display stand system 500 via the side airflow apertures 512, and an airflow 802c that enters the computing device housing defined by the display stand system 500 via the side airflow apertures 514. Furthermore, the airflows 802a, 802b, and 802c may exit the computing device housing defined by the display stand system 500 via the top airflow apertures 516. Furthermore, FIG. 8D illustrates how the airflows 802a, 802b, and 802c may move through the computing device housing and past the outer surface 202a of the heat dissipation cover 200 on their way to providing the airflow 802d that exits the computing device housing, and how the first airflow aperture 210a on each heat dissipation channel 210 that extends through the base wall 202 from the outer surface 202a to the component housing 206 operates to allow any of those airflows that are provided adjacent the outer surface 202a of the base wall 202 to enter the component housing 206 as an airflow 804a, as well as how the second airflow aperture 210b on each heat dissipation channel 210 that extends through the base wall 202 from the outer surface 202a to the component housing 206 operates to allow any of those airflows that are provided adjacent the outer surface 202a of the base wall 202 to enter the component housing 206 as an airflow 804b. As discussed above, in experimental embodiments using the linear configuration heat dissipation channels 210 on the heat dissipation cover 200 illustrated and described above, it has been found that the airflows 804 and 804b created by the first airflow apertures 210a and the second airflow apertures 210b included on the heat dissipation channels 210 reduce the temperature of the heat producing component 412 by 8-degrees Celsius relative to conventional component covers.

Thus, systems and methods have been described that provide for the dissipation of heat generated by a heat producing component by conducing that heat using a heat dissipation cover that is coupled to the heat producing component and that includes a base wall having an outer surface, and a plurality of side walls extending approximately perpendicularly from the base wall in order to define a component housing between the base wall and the plurality of side walls that houses the heat producing component. A plurality of heat dissipation channels are defined by the base wall and extend into the base wall from the outer surface, and each heat dissipation channel includes a respective first airflow aperture that extends through the base wall from the outer surface to the component housing and that allows an airflow that is provided adjacent the outer surface to enter the component housing to dissipate the heat generated by the heat producing component, and a respective second airflow aperture that is spaced apart from the first airflow aperture, that extends through the base wall from the outer surface to the component housing, and that allows an airflow that is provided adjacent the outer surface to enter the component housing to dissipate the heat generated by the heat producing component. As discussed above the heat dissipation cover of the present disclosure reduces the temperature of heat producing components relative to conventional component cover systems, thus providing for efficient heat dissipation in relatively small computing device housings.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A heat dissipation wall system, comprising:
   a base wall including an outer surface;
   a plurality of side walls extending approximately perpendicularly from the base wall in order to define a component housing between the base wall and the plurality of side walls; and
   a plurality of elongated heat dissipation channels that each:
   are defined by the base wall and extend into the base wall from the outer surface;
   include a first end that is located adjacent a first side wall that is included in the plurality of side walls; and
   include a second end that is located opposite that heat dissipation channel from the first end and adjacent a second side wall that is included in the plurality of side walls and that is located opposite the base wall from the first side wall such that the second side wall is substantially parallel to the first side wall,
   wherein each of the plurality of elongated heat dissipation channels includes:
   a respective first airflow aperture that extends through the base wall from the outer surface to the component housing and that is configured to allow an airflow adjacent the outer surface to enter the component housing; and
   a respective second airflow aperture that is spaced apart from the first airflow aperture, that extends through the base wall from the outer surface to the component housing, and that is configured to allow an airflow adjacent the outer surface to enter the component housing, and
   wherein a portion of each of the plurality of elongated heat dissipation channels extends between the first airflow aperture and the second airflow aperture without extending through the base wall to the component housing.

2. The heat dissipation wall system of claim 1, further comprising:
   at least one coupling feature that is included on the plurality of side walls and that is configured to couple to a computing device chassis.

3. The heat dissipation wall system of claim 1, wherein each respective first airflow aperture is located on the first end of each of the plurality of elongated heat dissipation channels, and wherein each respective second airflow aperture is located on the second end of each of the plurality of elongated heat dissipation channels that is opposite the first end.

4. The heat dissipated wall system of claim 1, wherein each of the plurality of elongated heat dissipation channels extend substantially along a length of the base wall.

5. The heat dissipation wall system of claim 1, wherein each of the plurality of elongated heat dissipation channels includes a linear configuration and is oriented substantially parallel to the other elongated heat dissipation channels.

6. The heat dissipation wall system of claim 1, wherein each of the plurality of elongated heat dissipation channels includes at least two sections that are provided in an angular configuration relative to each other, and is oriented substantially parallel to the other heat dissipation channels.

7. An Information Handling System (IHS), comprising:
   a chassis;
   a heat producing component that is coupled to the chassis; and
   a heat dissipation cover that is coupled to the chassis adjacent the heat producing component, wherein the heat dissipation cover includes:
   a base wall that includes an outer surface and that is spaced apart from the chassis;
   a plurality of side walls extending between the base wall and the chassis in order to define a component housing that is located between the base wall, the plurality of side walls, and the chassis, and that houses the heat producing component; and
   a plurality of elongated heat dissipation channels that each:

are defined by the base wall and extend into the base wall from the outer surface;
include a first end that is located adjacent a first side wall that is included in the plurality of side walls; and
include a second end that is located opposite that heat dissipation channel from the first end and adjacent a second side wall that is included in the plurality of side walls and that is located opposite the base wall from the first side wall such that the second side wall is substantially parallel to the first side wall,
wherein each of the plurality of elongated heat dissipation channels includes:
a respective first airflow aperture that extends through the base wall from the outer surface to the component housing and that is configured to allow an airflow adjacent the outer surface to enter the component housing; and
a respective second airflow aperture that is spaced apart from the first airflow aperture, that extends through the base wall from the outer surface to the component housing, and that is configured to allow an airflow adjacent the outer surface to enter the component housing, and
wherein a portion of each of the plurality of elongated heat dissipation channels extends between the first airflow aperture and the second airflow aperture without extending through the base wall to the component housing.

8. The IHS of claim 7, wherein the heat dissipation cover includes:
at least one coupling feature that is included on the plurality of side walls and that engages the chassis to couple the heat dissipation cover to the chassis.

9. The IHS of claim 7, wherein each respective first airflow aperture is located on the first end of each of the plurality of elongated heat dissipation channels, and wherein each respective second airflow aperture is located on the second end of each of the plurality of elongated heat dissipation channels that is opposite the first end.

10. The IHS of claim 7, wherein each of the plurality of elongated heat dissipation channels extend substantially along a length of the base wall.

11. The IHS of claim 7, wherein each of the plurality of elongated heat dissipation channels includes a linear configuration and is oriented substantially parallel to the other elongated heat dissipation channels.

12. The IHS of claim 7, wherein each of the plurality of elongated heat dissipation channels includes at least two sections that are provided in an angular configuration relative to each other, and is oriented substantially parallel to the other heat dissipation channels.

13. The IHS of claim 7, further comprising:
a thermal interface material engaging the heat producing component and the base wall.

14. A method for dissipating heat, comprising:
generating, by a heat producing component that is included on a chassis, heat;
conducting, by a heat dissipation cover that is coupled to the chassis via a plurality of sides walls and that includes a base wall that extends between the plurality of side walls to define a component housing that houses the heat producing component, the heat generated by the heat producing component; and
dissipating, via a plurality of elongated heat dissipation channels that each:
are defined by the base wall and extend into the base wall from the outer surface;
include a first end that is located adjacent a first side wall that is included in the plurality of side walls, and
include a second end that is located opposite that heat dissipation channel from the first end and adjacent a second side wall that is included in the plurality of side walls and that is located opposite the base wall from the first side wall such that the second side wall is substantially parallel to the first side wall,
the heat conducted by the heat dissipation cover,
wherein the dissipation includes:
allowing, by a respective first airflow aperture on each of the plurality of elongated heat dissipation channels that extends through the base wall from an outer surface of the base wall to the component housing, an airflow adjacent the outer surface of the base wall to enter the component housing; and
allowing, by a respective second airflow aperture that is spaced apart from the first airflow aperture and that extends through the base wall from the outer surface to the component housing, an airflow adjacent the outer surface of the base wall to enter the component housing,
wherein a portion of each of the plurality of elongated heat dissipation channels extends between the first airflow aperture and the second airflow aperture without extending through the base wall to the component housing.

15. The method of claim 14, wherein the heat dissipation cover is coupled to the chassis via at least one coupling feature include on the plurality of sides walls.

16. The method of claim 14, wherein each respective first airflow aperture is located on the first end of each of the plurality of elongated heat dissipation channels, and wherein each respective second airflow aperture is located on the second end of each of the plurality of elongated heat dissipation channels that is opposite the first end.

17. The method of claim 14, wherein each of the plurality of elongated heat dissipation channels extend substantially along a length of the base wall.

18. The method of claim 14, wherein each of the plurality of elongated heat dissipation channels includes a linear configuration and is oriented substantially parallel to the other elongated heat dissipation channels.

19. The method of claim 14, wherein each of the plurality of elongated heat dissipation channels includes at least two sections that are provided in an angular configuration relative to each other, and is oriented substantially parallel to the other elongated heat dissipation channels.

20. The method of claim 14, further comprising:
transferring, by a thermal interface material that engages the heat producing component and the base wall, the heat generated by the heat producing component to the heat dissipation cover.

* * * * *